United States Patent [19]

Berger et al.

[11] Patent Number: 4,506,299
[45] Date of Patent: Mar. 19, 1985

[54] DEVICE FOR SCANNING AN IMAGE IN SUCCESSIVE LINES, UTILIZING THE ELECTRICAL CHARGE TRANSFER, INCORPORATING A LINE MEMORY AND A TELEVISION CAMERA INCORPORATING SUCH A DEVICE

[75] Inventors: Jean-Luc Berger; Patrick Descure, both of Paris, France

[73] Assignee: Thomson-CSF, Paris, France

[21] Appl. No.: 368,005

[22] Filed: Apr. 13, 1982

[30] Foreign Application Priority Data

Apr. 16, 1981 [FR] France ............................ 81 07672

[51] Int. Cl.³ ............................................. H04N 3/14
[52] U.S. Cl. ..................................................... 358/213
[58] Field of Search .................. 358/213, 212, 44, 48; 357/30; 250/211 J, 578

[56] References Cited

U.S. PATENT DOCUMENTS 4,016,550 4/1977 Weimer ................................. 357/24
4,263,623 4/1981 Woo ..................................... 358/213
4,413,283 11/1983 Aoki ..................................... 358/213

FOREIGN PATENT DOCUMENTS 0025168 3/1981 European Pat. Off. .
0038725 10/1981 European Pat. Off. .
2481553 4/1980 France .

OTHER PUBLICATIONS

IEEE Electron Device Letters, vol. EDL-1, No. 5, May 1980, New York, Terakawa et al: "A New Organization Area Image Sensor with CCD Readout through Charge Priming Transfer", pp. 86–88.
IEEE Journal of Solid-State Circuits, vol. SC-15, No. 2, Apr. 1980, New York, Tseng et al: Charge Transfer and Blooming Suppression of Charge Transfer Photodiode Area Array", pp. 206-213.

Primary Examiner—Michael A. Masinick
Attorney, Agent, or Firm—Roland Plottel

[57] ABSTRACT

A device for the electric scanning of luminous images. It includes a matrix of N lines and M columns of photosensitive points. A system incorporating a line memory of M points receives in parallel the electric charges supplied by the M points of the same line parasitic charge are removed by diodes. The system insures the injection of the same predetermined quantity of charges between each of the photosensitive points and the output of the device. An output shift register receives in parallel the charges supplied by the line memory and supplies in series a picture scanning electric signal. This device is particularly intended for use in a television camera.

19 Claims, 10 Drawing Figures

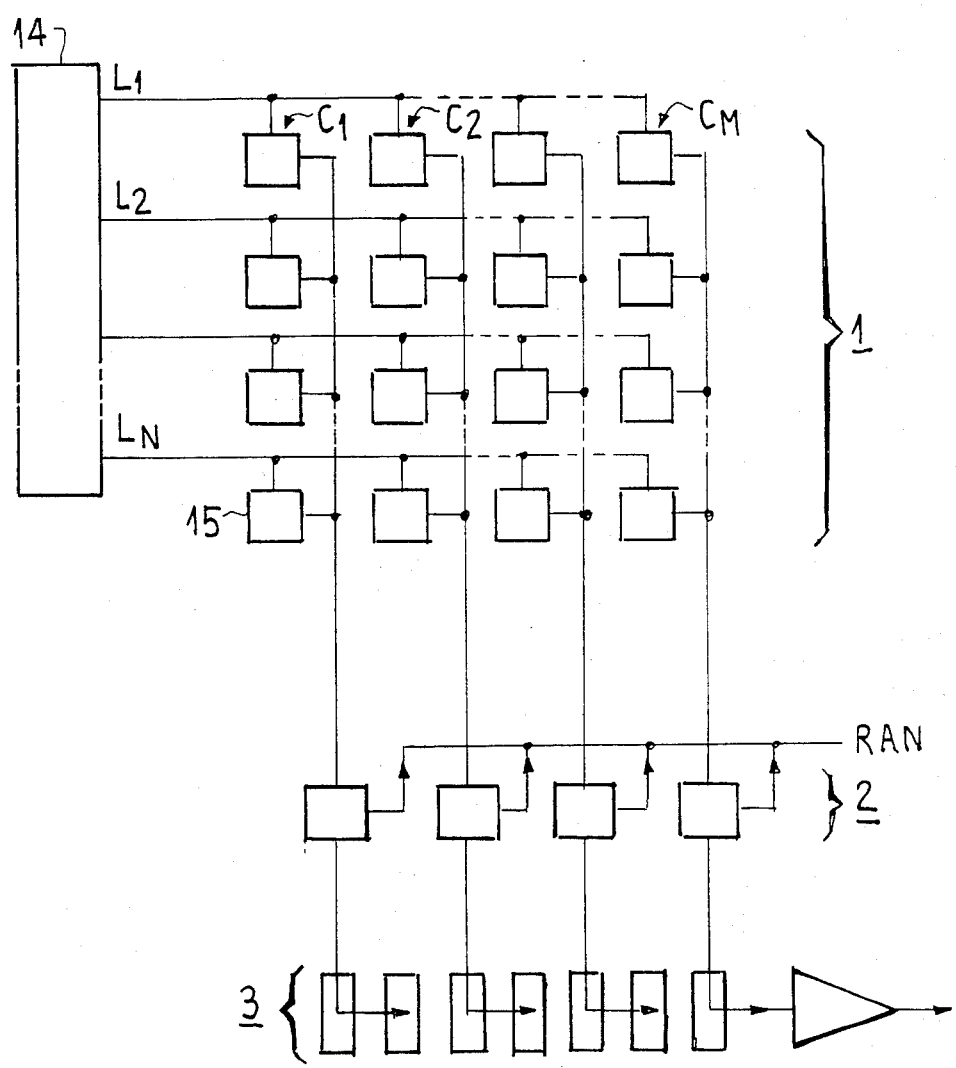
FIG_1
PRIOR ART

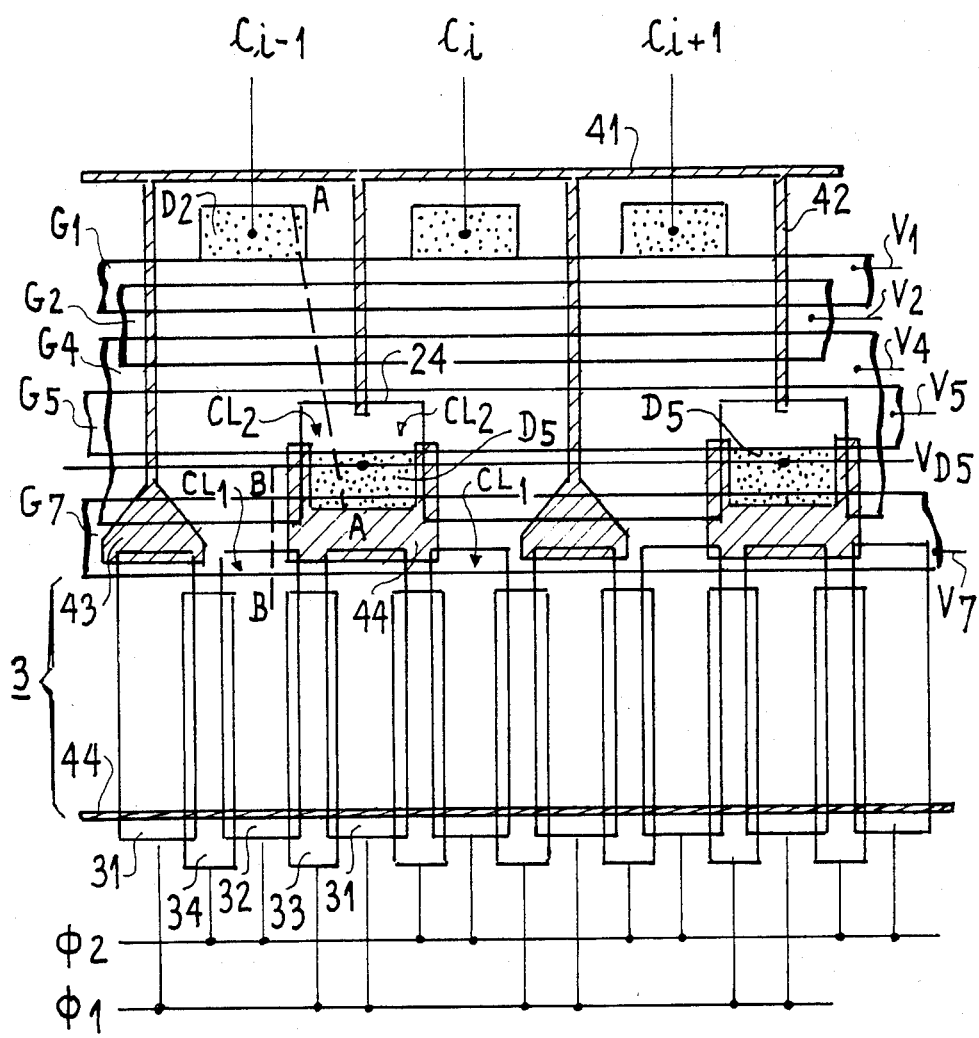

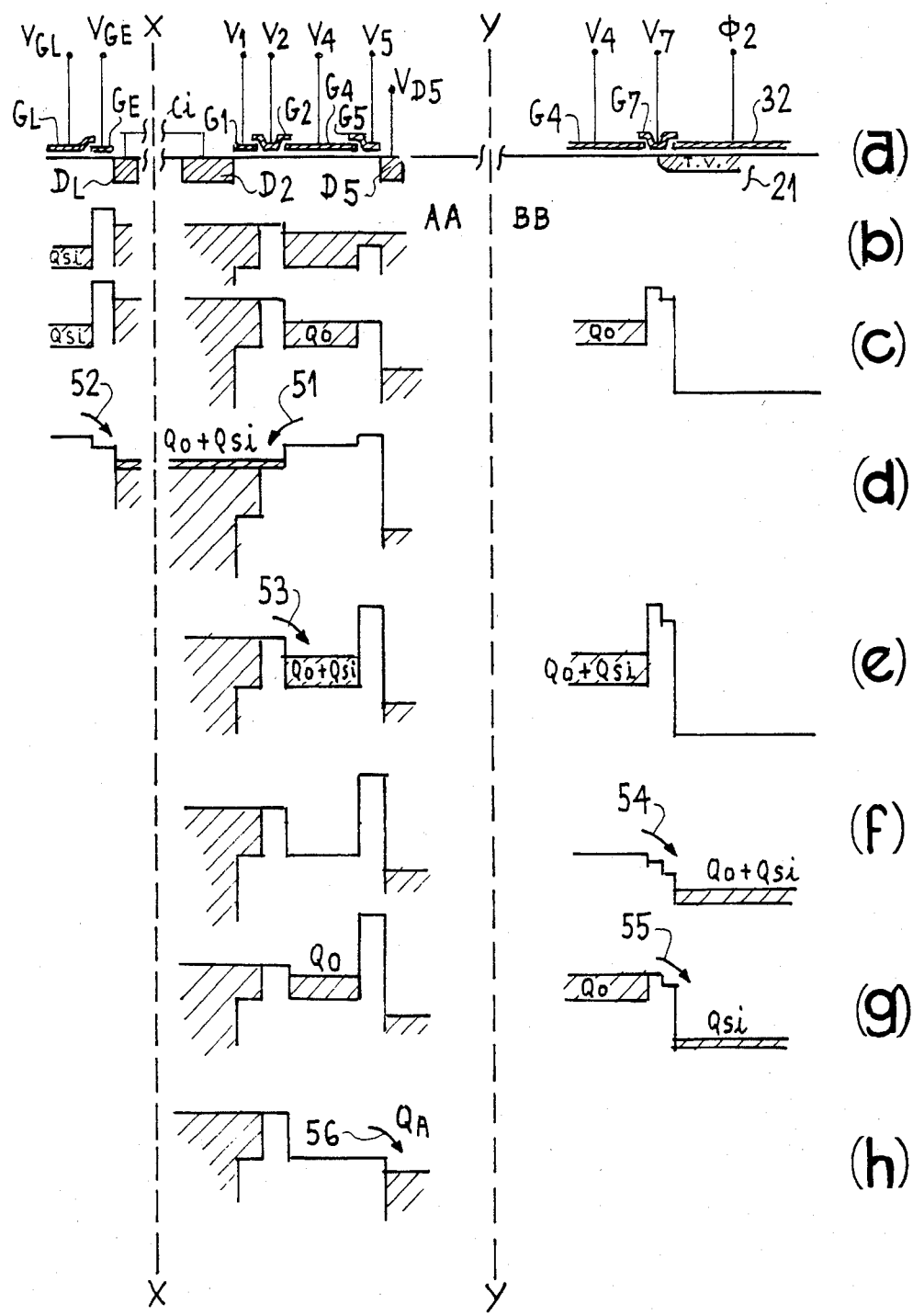

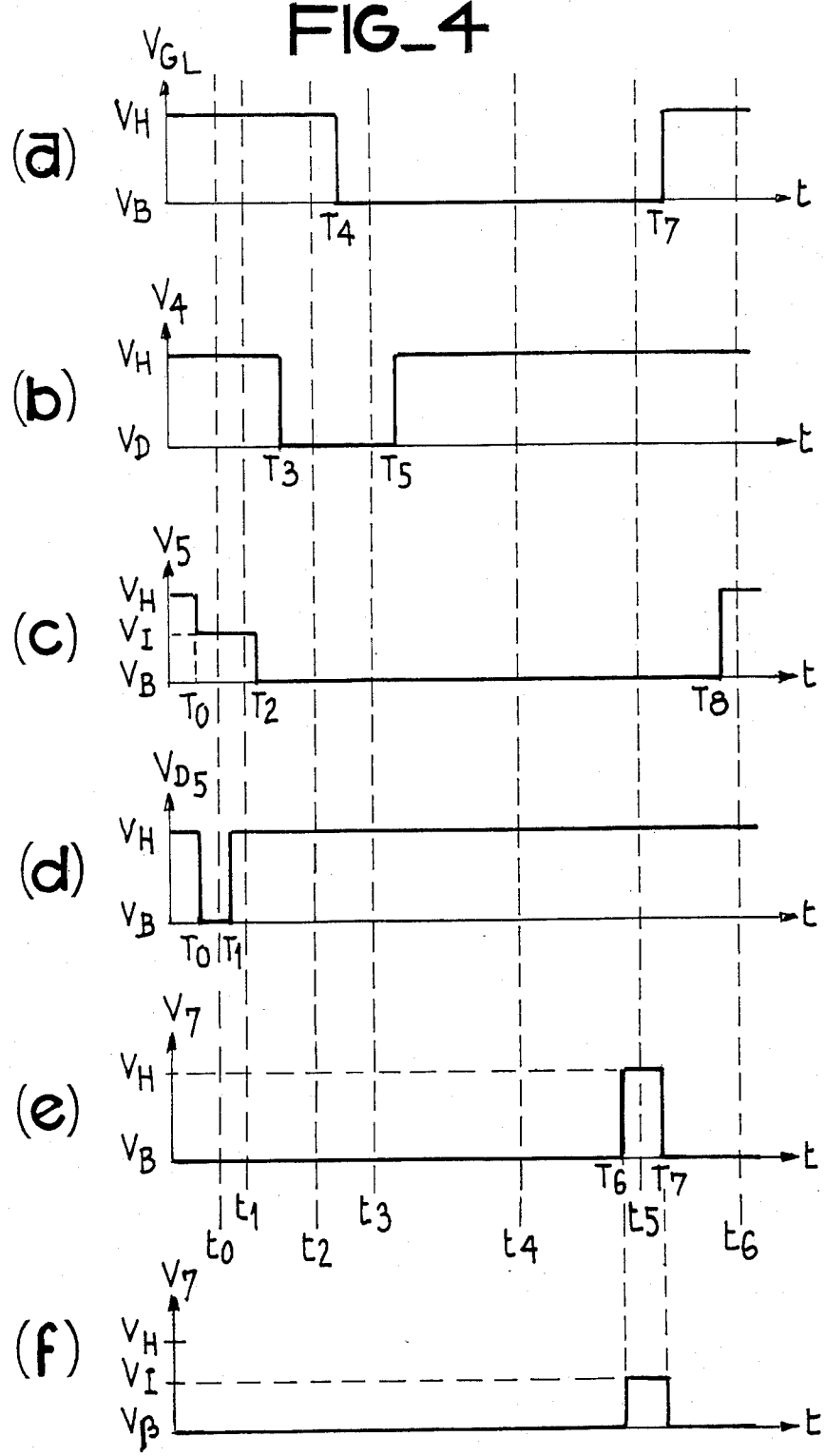

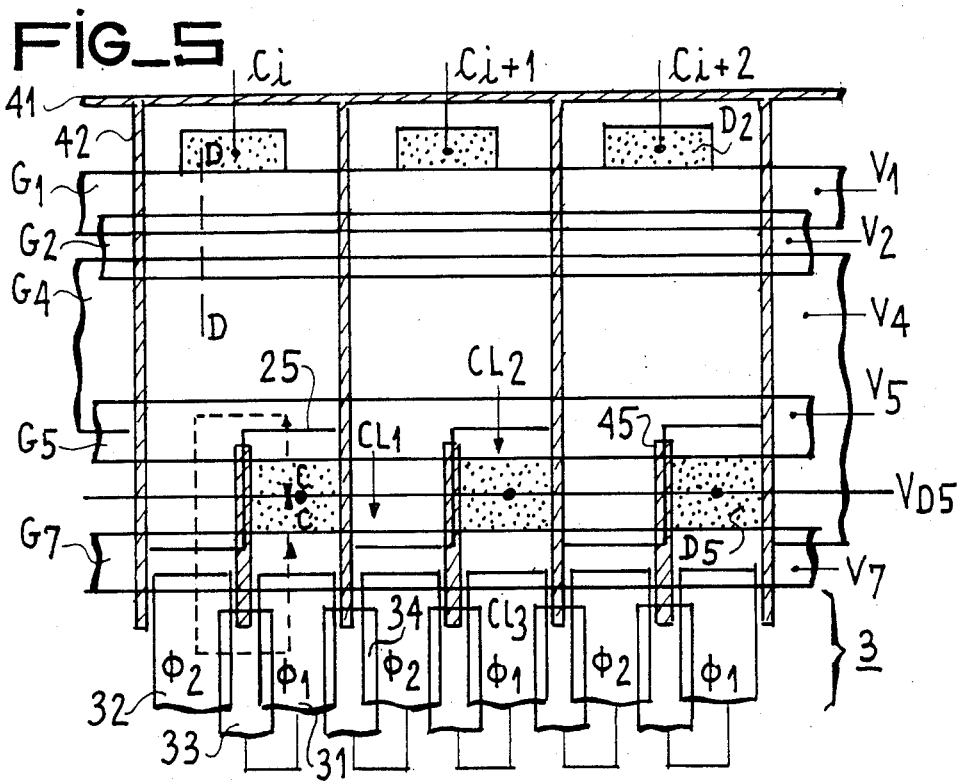
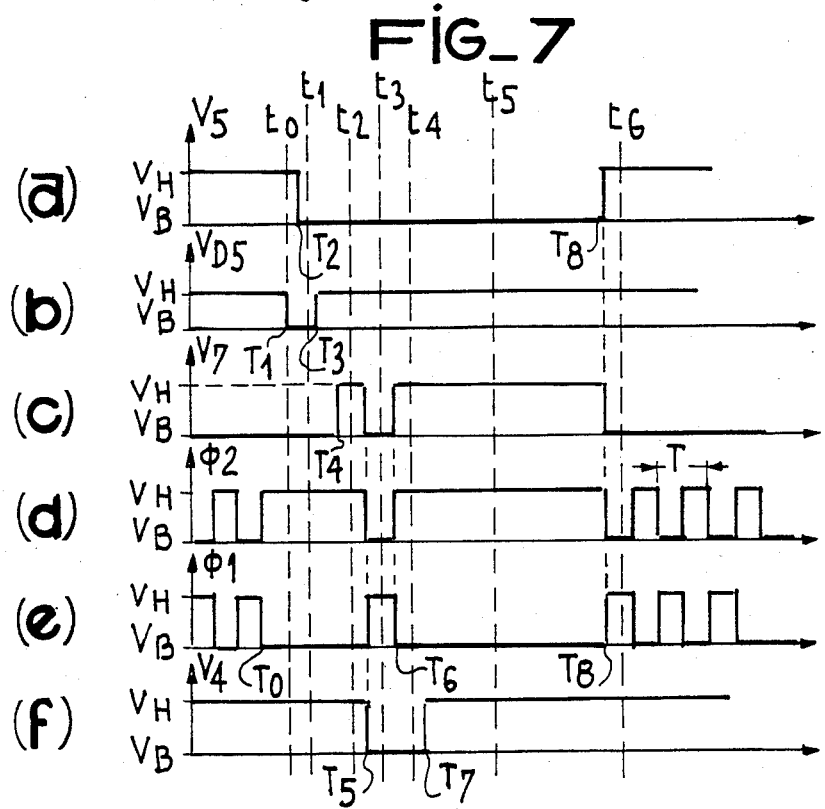

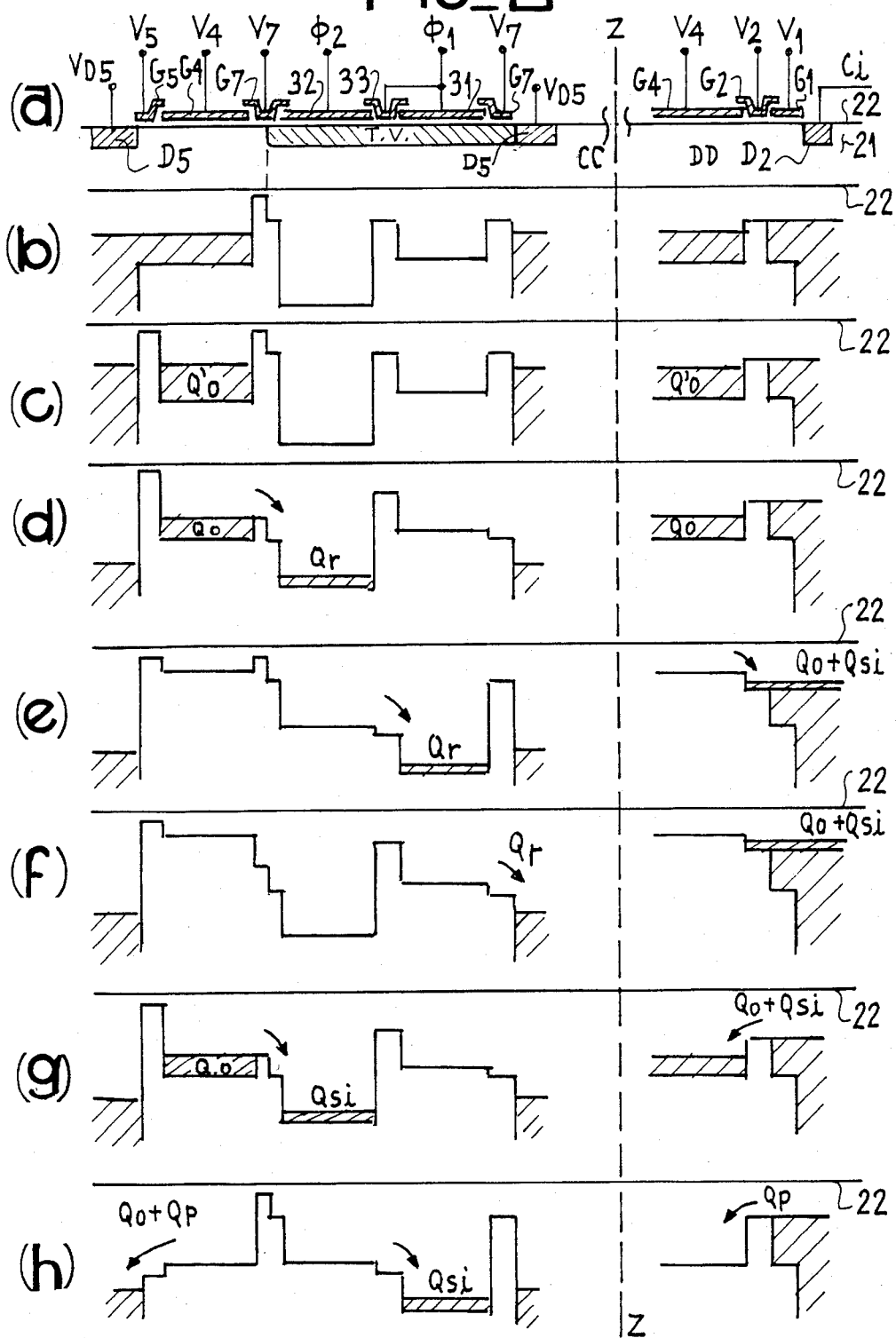

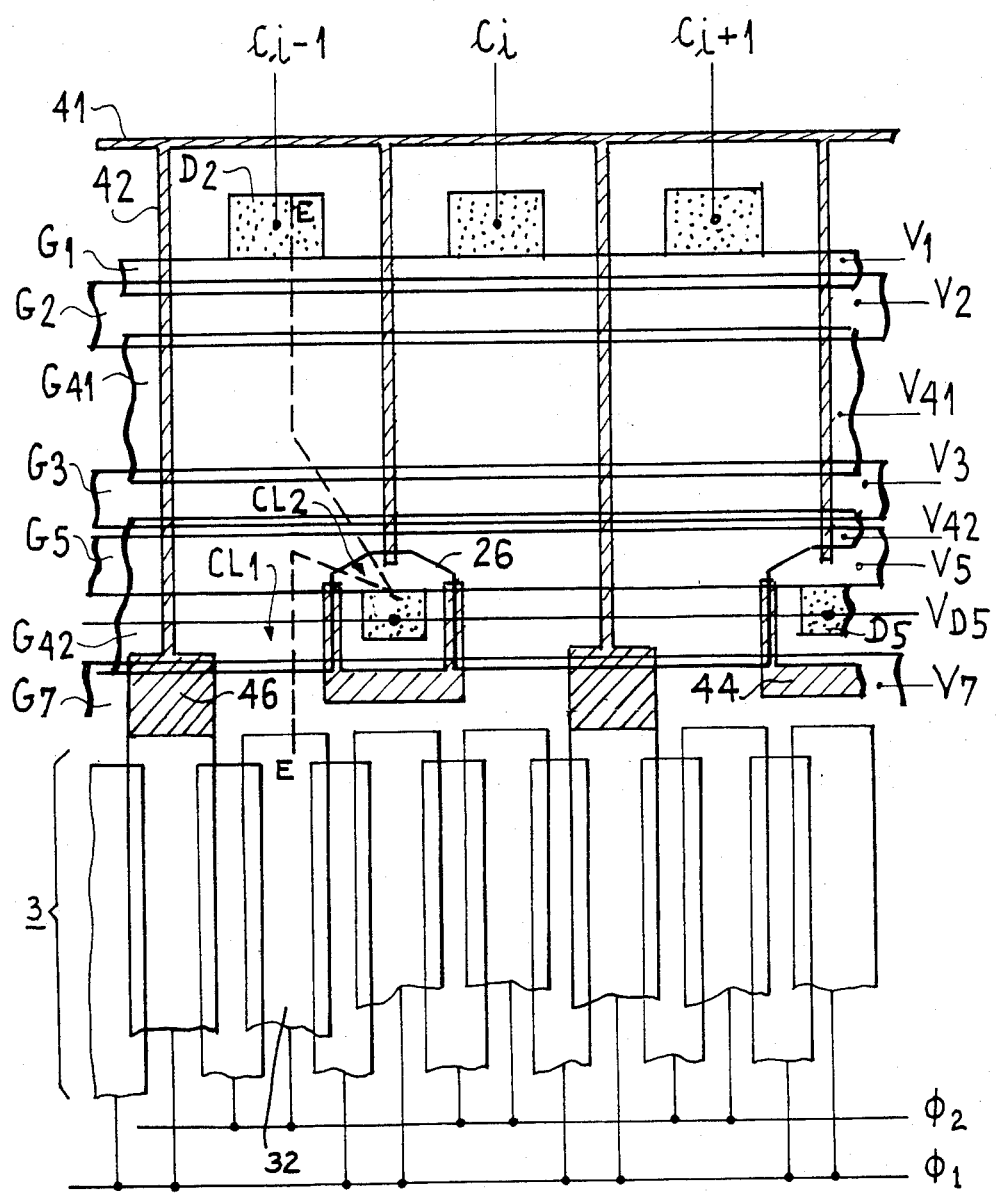

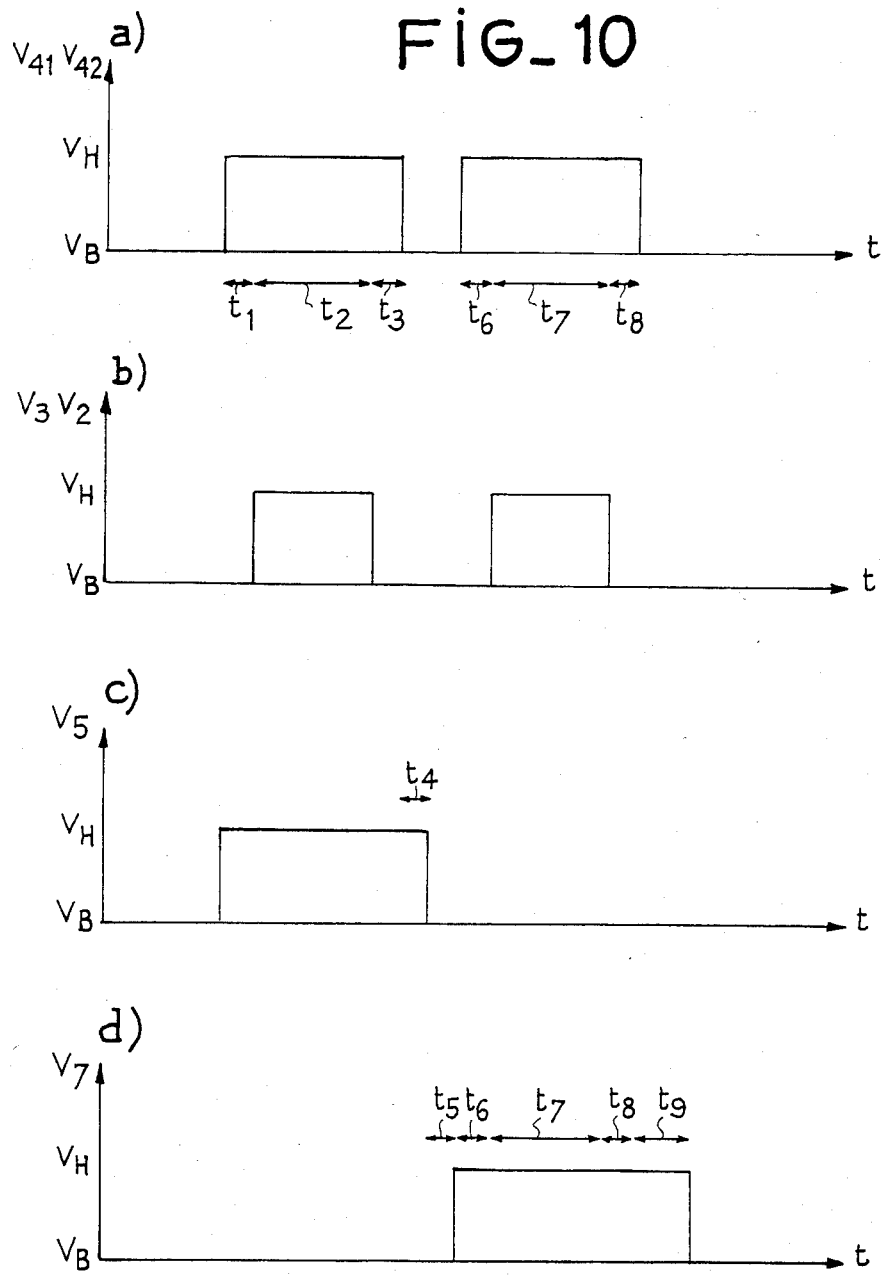

DEVICE FOR SCANNING AN IMAGE IN SUCCESSIVE LINES, UTILIZING THE ELECTRICAL CHARGE TRANSFER, INCORPORATING A LINE MEMORY AND A TELEVISION CAMERA INCORPORATING SUCH A DEVICE

BACKGROUND OF THE INVENTION

The invention relates to the electrical scanning of luminous images in successive lines forming frames, using a charge transfer device incorporating a line memory.

Various solid state devices scan an image and supply a television camera with a video electrical signal. They differ in the way in which the photosensitive zone is formed and in the system for reading and removing the charges produced by the image.

Charge transfer devices perform these, as described, for example, by SEQUIN and TOMPSETT, in "Charge Transfer Devices", pp. 152 to 169. In "frame transfer" or "interline structure" organisations the light radiation is received on charge transfer registers. The charge transfer then takes place over large areas, which is a disadvantage, since it is difficult to obtain high efficiency levels for such large areas. CID's (charge injection devices), do not have these disadvantages, but generally require reinjection of the charges into the semiconductor substrate, resulting in noise and difficulties in connecting with the capacitance values during and after reading.

There is also the question of compatibility between the time necessary for light integration and for charge transfer when the latter solution is adopted e.g. with the sweep time of the television screen. A 625 line standard, these times are generally about 52 $\mu$s for the display time of a line and 12 $\mu$s for the line return time.

In order to meet these different requirements, the Applicant Company has proposed a so-called "line transfer" structure, described in U.S. Pat. No. 4,430,672. This structure has a matrix of N lines×M photosensitive zones or points onto which an image to be scanned is projected and converted into electric charges called signal charges; a memory of M points, called the line memory, for successively receiving the signal charges stored by each line; a device for removing the parasitic charges associated with the line memory; and a CCD-type (charge coupled device) shift register receiving in parallel the content of the line memory and supplying in series the image scanning electric signal.

BRIEF SUMMARY OF THE INVENTION

The present invention relates to a picture scanning device of the line transfer type, as described above, in which improvements have been made to insure the storage of successive lines and the removal of parasitic charges, in order to improve the processing of small signals and reduce noise.

The device according to the invention has many of elementary photosensitive zones, called points, formed on the same semiconductor substrate in accordance with N lines and M columns, which are isolated from one another and form a matrix in which are created electrical charges, called signal charges, as a function of the illumination received; a charge transfer system with M columns incorporating a memory of M points, called the line memory, formed in the same semiconductor substrate and receiving in parallel the signal charges supplied by the M points of the same line; the line memory including a first grid ($G_1$), placed on the path of the charges and receiving a constant potential ($V_1$), which ensures the decoupling of this grid from the upstream part of the device; a parasitic charge removal device incorporating a many diodes and draining the parasitic charges from each of the columns, which insures the injection of the same predefined quantity of charges into each of the points of the line memory; and an analog shift register receiving in parallel the charges supplied by the line memory and supplying in series a picture scanning electric signal.

The invention also relates to a television camera incorporating such a picture scanning device.

BRIEF DESCRIPTION OF THE DRAWINGS

The invention is described in greater detail hereinafter relative to non-limitative embodiments and the attached drawings, which show:

FIG. 1 is a block diagram of the general organisation of a line transfer structure.

FIG. 2 a plan view of a first embodiment of the device according to the invention.

FIGS. 3 (a to h) a sectional view of the device of FIG. 2, illustrating the potentials at different times.

FIGS. 4 (a to f) signals which can be applied to the device of FIG. 2.

FIG. 5 a plan view of a second embodiment of the device according to the invention.

FIGS. 6 (a to h) a sectional view of the device of FIG. 5 illustrating the potentials at different times.

FIGS. 7 (a to f) signals which can be applied to the device of FIG. 5.

FIG. 8 a plan view of a third embodiment of the device according to the invention.

FIGS. 10 (a to d) signals which can be applied to the device of FIG. 8.

DETAILED DESCRIPTION OF THE PREFERRED EMBODIMENTS

Figure 9:
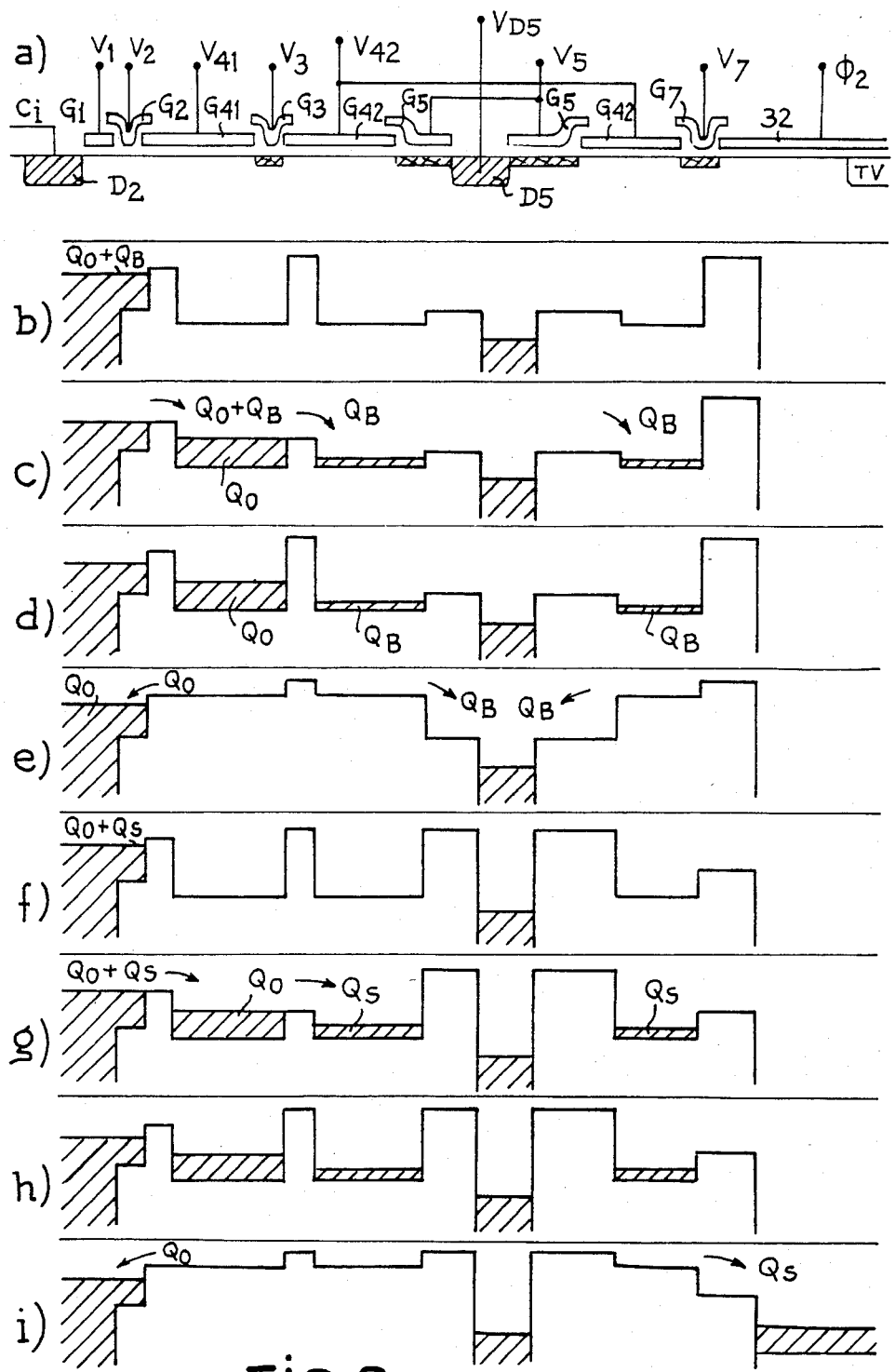
FIGS. 9 (a to i) a sectional view of the device of FIG. 8 illustrating the potentials at different times.

In the various drawings, the same references designate the same elements.

FIG. 1 shows the general organisation of a line transfer structure, as described in U.S. Pat. No. 4,430,672. This structure includes a photosensitive zone 1, a line memory 2 and an analog output shift register 3.

The photosensitive zone 1 receives the luminous image to be scanned and converts it into electrical charges, called signal charges. The term "luminous image", relates not only to the detection of visible wavelengths, but also the surrounding wavelengths, particularly in the infrared. The photosensitive zone has many elementary zones 15, which are also called points, arranged in N lines, designated $L_1$, $L_2$ ... $L_N$ and M columns, designated $C_1$, $C_2$ ... $C_M$ and forming a matrix. The photosensitive points of the same line are interconnected and connected to a control device 14, which enables successive addressing of the lines. This device has e.g. a MOS-type shift register. The photosensitive points 15 of the same column are connected to the same connection, subsequently called the column connection towards line memory 2.

Thus, in parallel, line memory 2 receives the signal charges produced at each of the photosensitive points 15 of the same line and then transfers them in parallel to register 3. A device for restoring the level of the column connections (RAN connection in the drawing) and a device for eliminating parasitic charges (not shown in FIG. 1) are also associated with line memory 2.

Register 3 is an analog shift register supplying the information received in parallel in the series mode. This information constitutes the optical image scanning video signal received in photosensitive zone 1. The register is preferably of the charge transfer or CCD type.

The coordination of the different picture integration operations in photosensitive zone 1, the transfer of lines into line memory 2 and then the transfer of signals into register 3 for the different lines are effected in the following manner.

The integration of the image is permanently carried out over the entire photosensitive matrix 1, except for the line addressed by register 14. During the line return time, the content of line memory 2 is transferred into shift register 3, and the input of the line memory is then closed. During the following line time, the content of register 3 is removed in series and the connection between line memory 2 and register 3 is interrupted. During this time, in a first phase there is a level restoring of the reader of points 15 (RAN connection), connected to line memory 2; and in a second phase one of the lines L of zone 1 is transferred to line memory 2, with the selection (or addressing) of a line being insured by register 14.

The following stage corresponds to the line return time during which the content of line memory 2 is discharged into register 3, the latter having been entirely scanned during the preceding stage.

According to another embodiment, the selection of a line, its transfer into the line memory and then into the shift register takes place entirely during the line return time, the line time being reserved for the level restoring of the reader, which improves as it becomes longer, and for the series removal from the shift register.

FIG. 2 shows a plane view of a first embodiment of the device according to the invention. The connections coming from the M column C of the photosensitive matrix ($C_{i-1}$, $C_i$, $C_{i+1}$), each lead to a receiving diode $D_2$, of the signal charges $Q_{si}$ coming from the matrix. It is produced, for example, by doping a semiconductor substrate, which is advantageously the same as that on which the photosensitive matrix 1 is formed. Thus, the device has M charge transfer columns, delimited by insulating barriers 42, corresponding respectively to the M column connections of the photosensitive matrix.

The diodes D are aligned and are adjacent on the underside to electrode or grid $G_1$ in strip form, which forms a screen for the charges between diodes $D_2$ and the remainder of the device shown in FIG. 2, which prevents parasitic charges from being transmitted on a column connection C. In charge transfer devices it is particularly important to provide protection against parasitic charges, whose amplitude can vary from one point to another of the circuit as a function of the geometrical variations of the elements, and which limit the dynamics of the signal. To this end, grid $G_1$ is connected to a constant potential $V_1$.

Following the screen grid $G_1$, there is a grid $G_2$ in the form of a strip parallel to $G_1$ and raised to a second potential $V_2$, this has the function of fixing the potential of the column connections.

There is then a grid $G_4$, whose function is to store the charges, and is in strip form having e.g. rectangular notches 24 between two columns and every other column. In at least part of each of the notches 24, there is a diode $D_5$ having the function of removing the parasitic charges. The diodes $D_5$ are connected to a periodic potential $V_{D5}$.

It may be seen on FIG. 3 that grid $G_2$ is surrounded by two coplanar grids $G_1$ and $G_4$. So the width of grid $G_2$ is defined in a single photogravure operation by the distance between grids $G_1$ and $G_4$. A better homogeneity is thus obtained on the width of grid $G_2$ which can greatly be reduced.

The parasitics due to a variable penetration of diodes $D_2$ under the grid $G_2$ for the different photosensitive points are eliminated. This variable penetration produces variable transfer times for the charge signal of each diode $D_2$ towards the memory; moreover, it increases the rapidity of the charge signal transfer from $D_1$ and $D_2$ to the memory, because of the small width of $G_2$.

The device also has a grid $G_5$ in the form of a strip covering storage grid $G_4$ with an insulating layer level with notches 24, so as to be adjacent to above diodes $D_5$. Grid $G_5$ receives a periodic potential $V_5$ and makes it possible to control the access of the charges to diodes $D_5$.

Parallel to grid $G_5$ and slightly covering the lower part of diodes $D_5$ there is a grid $G_7$ to which is applied a periodic potential $V_7$ making it possible to control the access to shift register 3.

The insulating barriers 42 are interrupted level with the notches 24 or are terminated, if there is no notch, by an extension, e.g. in the form of a triangle 43. Diodes $D_5$ are surrounded by a U-shaped insulating barrier 44 in such a way that diode $D_5$ remains accessible to charges coming from the diodes $D_2$ of each of the columns. In this way, two channels per column are defined: a first channel $CL_1$ limited by an insulating barrier 42, its extension 43 and a U-shaped branch 44 on the outside; and a second channel $CL_2$ limited by the inside of the same U-shaped branch 44 and the second insulating barrier 42 limiting the column in question.

Register 3 is a C.C.D. register with two phases $\phi_1$ and $\phi_2$. It has two series of storage electrodes 31, 32 and two series of transfer electrodes 33, 34, all having a substantially rectangular shape and positioned perpendicular to grids $G_1$ to $G_7$. Grids 31 are connected to the periodic potential $\phi_1$ and grids 32 to the periodic potential $\phi_2$. Grids 33 and 34 are respectively placed between the grid pairs 32, 31 and 31, 32 in the charge transfer direction on an extra thickness of insulant and are respectively connected to potentials $\phi_1$ and $\phi_2$. Moreover, the electrodes of register 3 are positioned in such a way that electrodes 31 originate on insulating barriers 43 or 44, electrodes 32 being located in the extension of channel $CL_1$. The registers 3 is bounded at the bottom by a horizontal insulating barrier 44, in the same way as the device is bounded at the top, also by an horizontal insulating barrier 41.

In this embodiment, as in the following embodiments, the various insulating barriers described can be constructed in a known manner, e.g. by overdoping a substrate having the same type of conductivity as the latter, or a localized extra-thickness of the insulating layer (generally oxide) covering the substrate. The latter solution is possibly accompanied by an overdoping of the substrate formed beneath the extra-thick insulation. The various electrodes can also be formed in known manner using e.g. metal or polycrystalline silicon. Finally, to prevent the formation of interference charges, each diode and part of the adjacent grids is covered with a layer which is opaque to light beams, such as an aluminium layer.

FIG. 3a is a sectional view of the device of FIG. 2 and diagrams 3b to 3h illustrate the surface potential in the semiconductor substrate at different times, the surface potential being represented on these and the following diagrams as increasing in the downward direction. To facilitate the understanding of the operation of the device, the diagram of FIG. 3a is a section made at different locations.

To the left of an axis XX is shown a photosensitive point of matrix 1. For example, it is constituted by a grid $G_L$ formed by an electrode with a photodetecting MOS capacitance raised to a periodic potential $V_{GL}$ and which slightly overlaps the following grid $G_E$. This is a screen for the charges, separating the actual photosensitive zone from the column connection and is raised to a constant potential $V_{GE}$. The screen grid $G_E$ is followed by reading diode $D_L$ formed in the substrate, which constitutes the starting point for the column connection $c_i$. In a variant not shown, the photosensitive point has a second image detection zone, whose frequency sensitivity is complementary to the MOS capacitance realised e.g. by a photodiode.

To the right of axis XX is shown a section in the device of FIG. 2 along a line AA passing through diode $D_2$, grid $G_1$, grid $G_4$ and the second channel $CL_2$. Grid $G_4$ is followed by grid $G_5$, which also slightly overlaps it, $G_5$ is followed by diode $D_5$. It can be seen that grid $G_2$ slightly overlaps the surrounding grids $G_1$ and $G_4$. It is also possible to see the column connections $c_i$ connecting diodes $D_L$ and $D_2$.

Following diode $D_5$, it is possible to see a section in the device of FIG. 2 along a line BB along the first channel $CL_1$ and separated in FIG. 3a from what precedes it by an axis YY. The section of the first channel starts level with grid $G_4$ and continues up to an electrode 32 of register 3, $G_4$ and 32 being separated by grid $G_7$, which slightly overlaps them. It should be noted that, both in this and the following embodiments, the operation of the device is compatible with a "volume" charge transfer into output register 3. As is known, the charge transfer in the volume of the semiconductor substrate is faster than the surface transfer and its efficiency is better. Volume transfer differs from surface transfer mainly through the higher potentials applied and a doping of that part of the semiconductor substrate where there is a transfer having a conductivity type which is opposite to that of the remainder of the substrate.

The drawings show a volume transfer operation and consequently a "hatched" doped area, designated T.V., extending beneath the electrodes of register 3 up to half of grid $G_7$.

These different elements are preferably formed on the same semiconductor substrate 21, covered with a insulating layer which is not shown. The various electrodes are separated, in the case where they overlap, by an insulating layer, which, for reasons of clarity, also is not shown.

The various diagrams (a to e) of FIG. 4 show the evolution in time of control signals applied to the device of FIG. 3.

FIG. 4a represents the potential $V_{GL}$, which is at a constant high level ($V_H$), except during a time interval $T_4$ to $T_7$ corresponding to the time for the transfer of the charges accumulated in a considered photosensitive point to the line memory and then to register 3 of FIG. 2 and which essentially corresponds to the line return time.

FIG. 4d represents potential $V_4$, which is at a constant high level ($V_H$), except between times $T_3$ and $T_5$ surrounding time $T_4$.

FIG. 4c represents the potential $V_5$, which is at a high level ($V_H$) up to time $T_0$, when it passes to an intermediate level ($V_I$) and remains there up to a time $T_2$, $T_0$ and $T_2$ being before time $T_3$. As from time $T_2$, $V_5$ remains at a low level $V_B$ up to a time $T_8$, which is after time $T_7$, when it again rises to the high level $V_H$.

FIG. 4d represents potential $V_{D5}$, which is at a constant high level ($V_H$), except between time $T_0$ and a time $T_1$ between $T_0$ and $T_2$ during which it is at a low level ($V_B$).

FIG. 4e represents potential $V_7$, which is at a constant low level, except between time $T_6$, which precedes time $T_7$, and $T_7$, during which it is at a high level ($V_H$).

In FIG. 3b, at a time $t_0$ between time $T_0$ and $T_1$, diode $D_5$ is at low level permitting the injection of charges beneath grid $G_4$. This injection is limited by a constant potential $V_2$ applied to grid $G_2$, which implies that the low level of $V_{D5}$ exceeds potential $V_2$. Thus, it would appear that grid $G_2$ fixes the potential level of the column connections $c_i$. Moreover, to the left of line XX, a signal charge quantity $Q_{si}$ is present beneath grid $G_L$ (hatched area).

The diagram of FIG. 3c shows the potentials at a time $t_1$ between $T_1$ and $T_2$. At this time, potential $V_{D5}$ is at high level and therefore a charge quantity $Q_0$ is isolated beneath grid $G_4$ (hatched area) by potentials $V_2$ and $V_5$ respectively applied to grids $G_2$ and $G_5$. This charge quantity $Q_0$ is dependent on the potential $V_1$, which is then applied beneath grid $G_5$, potential $V_2$ being assumed lower than $V_I$.

At a time $t_2$ between $T_3$ and $T_4$, voltages $V_4$ and $V_5$ are returned to low level, which has the effect of transferring the charge quantity $Q_0$ to diodes $D_2$ and, via connections $c_i$, to diodes $D_L$. This is represented by an arrow 51 on the part of diagram 3d between lines XX and YY.

At a subsequent time $t_3$, between $T_4$ and $T_5$, the potential applied to grid $G_L$ of the MOS capacitance of the photosensitive zone is brought to a low level, which has the effect of transferring charge quantity $Q_{si}$ to diodes $D_L$ (arrow 52 in the left-hand part of FIG. 3d).

Diagram 3e represents the situation at a time $t_4$, between times $T_5$ and $T_6$. During this time, the potential applied to grid $G_4$ is raised to a high level, which makes it possible to transfer (arrow 53) charges $Q_0 + Q_{si}$ beneath grid $G_4$ in two channels, which is illustrated to the right and left of axis YY.

Diagram 3f represents the situation at a time $t_5$ between $T_6$ and $T_7$ during which the potentials of channel $CL_2$ are unchanged, while the potential of grid $G_7$ placed on channel $CL_1$ rises enabling the transfer (arrow 54) of the charges $Q_0 + Q_{si}$ present beneath grid $G_4$ to shift register 3, materialised by one of its electrodes 32. Thus, the known charge quantity $Q_0$ is effectively transferred into register 3 at the same time as signal charge $Q_{si}$.

Generally, it is possible to avoid the transfer of the charge $Q_0$ into register 3, in which case only signal charge $Q_{si}$ is transferred. This makes it possible to eliminate the so-called spatial noise on $Q_0$ from one column to the next, the noise being due to variations in the changes caused by variations in the oxide thickness covering the substrate, variations in the threshold voltages, etc. This can be brought about by raising grid $G_7$ to an intermediate potential $V_1$, represented in diagram 4$f$ and whose amplitude is between $V_B$ and $V_H$ during times $T_6$ to $T_7$. The value $V_I$ of this intermediate potential is advantageously equal to the intermediate potential applied to grid $G_5$ between times $T_0$ and $T_2$. In this way, an operation described by diagram 3$g$ is obtained, where it is possible to see that the potential applied to grid $G_7$ is such that only the signal charge $Q_{si}$ (arrow 55) can be transferred from grid $G_4$ to electrode 32 above grid $G_7$, charge $Q_0$ remaining beneath grid $G_4$. It should be noted that in this variant, the phase corresponding to diagram 3$b$ can be eliminated. This stage is an injection stage of $Q_0$ into the device, which is no longer necessary because this charge is no longer eliminated.

It is essential that the charge signal transfer $Q_{si}$ from diodes $D_2$ under grid $G_2$ then under grid $G_4$ includes the addition of a charge quantity $Q_o$, the capacity of the diodes $D_2$ being quite important. But the transfer of the charge signal $Q_{si}$ to the reading register doesn't necessitate the addition of the charge quantity $Q_O$, the capacity of the grid $G_4$ being small, of the same dimension as the capacity of the register.

At a time $t_6$, following time $T_8$ and at a random point during the line time, the potential applied to grid $G_5$ being raised to the high level $V_H$, there is an elimination of any parasitic charge ($Q_B$) from a column connection, by channel $CL_2$ to diode $D_5$. These parasitic charges result e.g. from overilluminated points of the photosensitive matrix.

On referring to the variant described by diagrams 4$f$ and 3$g$, it is necessary that at time $t_6$, the potential applied to grid $G_5$ is equal to the intermediate level $V_1$ and not to $V_H$ in order to ensure that only charge $Q_0$ is beneath grid $G_4$ and to eliminate possible parasitic charges by $D_5$.

In this latter variant, the residual spatial noise can only be due to variations of the threshold, doping or insulation thickness between grids $G_7$ and $G_5$, which is minimal in practice, bearing in mind the geometrical proximity of these grids.

Thus, this structure permits the injection of a predetermined quantity of $Q_0$, first beneath the storage grid $G_4$ and then onto diodes $D_L$ and $D_2$ establishing the connection between photosensitive matrix and the line memory, in order to improve the transfer of signal charges $Q_{si}$. This quantity of charges $Q_0$ is consequently injected by using the structure of the line memory and the parasitic charge elimination device, so that no auxiliary device is required.

Moreover, in this embodiment, each parasitic charge removal diode $D_5$ is common to both columns making it possible either to increase the storage capacity of the line memory (more extensive grid $G_4$) or to permit a smaller horizontal spacing and consequently a reduced overall size of the device.

FIG. 5 is a plan view of a second embodiment of the invention, where the generation of the charge quantity $Q_0$ is completely free from spatial noise.

In FIG. 5, it is possible to see diodes $D_2$, grid $G_1$, grid $G_2$ and $G_4$, which in this case has a notch 25 level with each of the columns and, as before, each of these notches contains a diode $D_5$. Grids $G_5$ and $G_7$ are arranged parallel to the other grids on either side of diodes $D_5$. Perpendicular to these, it is possible to see the electrodes 31 to 34 of register 3.

Once again, there are vertical insulating barriers 42 between the columns which extend up to electrodes 34 of register 3. Moreover, each of the columns is vertically subdivided by an insulating barrier 45, defining to its left a first channel $CL_1$ extending from grid $G_4$ to an electrode 32, and to its right a second channel $CL_2$ containing diode $D_5$, which then extends between barriers 45 and 42, and finally a third channel $CL_3$ extending from electrode 31 of register 3 to diode $D_5$, i.e. opposite to channel $CL_2$.

To the left of axis ZZ, FIG. 6$a$ shows a section along a closed line CC formed as from diode $D_5$ around the insulating barrier 45 of FIG. 5; to the right of axis ZZ there is a section along a line DD from grid $G_4$ to diode $D_2$, these two sections being joined to make it easier to explain the operation of the device of FIG. 5.

In succession starting from the left, FIG. 6 shows channel $CL_2$ represented by diode $D_5$, grid $G_5$ slightly overlapping the following grid $G_4$, the latter being common to channel $CL_2$ and $CL_1$, then channel $CL_1$ represented by grid 32 separated from grid $G_4$ by grid $G_7$, which slightly overlaps both of them. Grid 31 is separated from grid 32 by grid 33, which slightly overlaps them and which forms the separation between channels $CL_1$ and $CL_3$, then channel $CL_3$ constituted by grid $G_7$ and diode $D_5$. To the right of line ZZ are successively provided grid $G_4$, grid $G_1$ separated from $G_4$ by grid $G_2$ which slightly overlaps them, followed by diode $D_2$, which receives column connections $c_i$.

As before, there is a doping zone extending from grid $G_7$ to electrodes 31, 32 and 33 of register 3 corresponding to the volume transfer type of operation of the register.

The various diagrams (a to f) of FIG. 7 show the evolution in time of the various control signals applied to the device of FIG. 5. These control signals are periodic potentials, whose amplitude varies between a low level $V_B$ for all the diagrams and a high level $V_H$ for all the diagrams, but these different potentials are not necessarily equal.

Diagram 7$a$ represents potential $V_5$ which is at a high level, except from a time $T_2$ and up to a time $T_8$, the time between $T_2$ and $T_8$ being essentially that of the line return.

Diagram 7$b$ represents potential $V_{D5}$ which is at a high level, except between times $T_1$ and $T_3$ surrounding time $T_2$, when it is at a low level.

Diagram 7$c$ represents potential $V_7$ which is at a low level up to a time $T_4$ after time $T_3$ at which it passes to a high level, up to a subsequent time $T_5$ when it again passes to a low level, up to a subsequent time $T_6$ when it again passes to a high level, up to $T_8$ when it again passes to a low level.

Diagram 7$d$ represents potential $\phi_2$, which is a square wave signal of cycle or period T up to a time $T_0$ preceding time $T_1$ at which it passes to a high level up to time $T_5$. It then passes to a low level, which it maintains up to a time $T_6$, when it passes to a high level up to a time $T_8$, and then it again becomes a square wave signal of the same period as before.

Diagram 7$e$ shows potential $\phi_1$, which is complementary to potential $\phi_2$.

Diagram 7$f$ represents potential $V_4$ which is at a high level up to time $T_5$, at which it passes to a low level up to time $T_7$ between $T_6$ and $T_8$, when it again passes to a high level.

FIG. 6b shows the surface potential in the semiconductor level with FIG. 6a at a time $t_0$ between $T_1$ and $T_2$. For reasons of clarity in this and the following diagrams, each of them shows the surface of the semiconductor substrate 22. At this time $t_0$, potential $V_{D5}$ applied to diode $D_5$ is at a low level, but potential $V_5$ applied to grid $G_5$ is at a high level. As a result, it is possible for the charges to invade the area located beneath grid $G_4$, but this invasion (hatched area) is limited by grid $G_7$ raised to potential $V_7$, which is at low level.

FIG. 6c shows the surface potential at a time $t_1$ between $T_2$ and $T_3$. The only change from the preceding drawing is the passage of potential $V_5$ to low level, which isolates a charge quantity $Q'_0$ beneath grid $G_4$.

Diagram 6d represents the surface potential at a time $t_2$ between times $T_4$ and $T_5$. The difference from the previous diagram is that potential $V_7$ applied to grid $G_7$ passes to a high level, which has the effect of subdividing the charge quantity $Q'_0$ beneath electrode $G_4$ into a quantity $Q_0$ remaining beneath this grid as a function of the potential level $V_H$ of $V_7$, and defined by the surface potential beneath $G_7$ out of the doped zone T.V., and a residual charge quantity $Q_r$, which is transferred beneath grid 32 to which is applied potential $\phi_2$, which at this instant is at high level.

Diagram 6e shows the surface potential at time $t_3$ between times $T_5$ and $T_6$. During this period, potential $\phi_2$ is brought to low level, which has the effect of transferring charge $Q_r$ beneath electrode 31, potential $\phi_1$ then being at high level. Moreover, as the potential $V_4$ of grid $G_4$ is at low level, the charge quantity $Q_0$ is transferred to diode $D_2$ and to column connections $c_i$, which is shown to the right of axis ZZ, reference again being made to the fact that potentials $V_1$ and $V_2$ are constant and higher than the low level of $V_4$. The potential $V_7$ applied to grid $G_7$ is at a low level during this time, so that access to register 3 is impossible.

Moreover, at time $t_3$ the presence of charges $Q_{si}$ are shown on the column connection $c_i$. The transfer of $Q_{si}$ from a photosensitive point of column $c_i$ takes place in the manner described relative to FIG. 3d. This transfer can take place at any time before $t_5$ (FIG. 6g) but it is preferable for $Q_0$ to be transferred before or at the same time as $Q_{si}$ on column connection $c_i$.

Diagram 6f represents the surface potential at a time $t_4$ between times $T_6$ and $T_7$. During this period, the passage of potential $V_7$ to a high level makes it possible to remove the charges $Q_r$, previously beneath electrode 31, to diode $D_5$ via channel 3. During this same period, $\phi_2$ returns to a high level and $\phi_1$ to low level.

Diagram 6g represents the surface potential at a time $t_5$ between $T_7$ and $T_8$. During this period, the potential applied to grid $G_4$ returns to high level, so that the charge quantity $Q_0+Q_{si}$ present on connection $c_i$ (right-hand part of the drawing) is transferred beneath grid $G_4$ and then partly beneath electrode 32, while charge quantity $Q_0$ is held back by the potential barrier beneath grid $G_7$ in the same way as at time $t_2$. In this way, only $Q_{si}$ is transferred beneath electrode 32 of output register 3.

Diagram 6h represents the surface potential at a time $t_6$ following time $T_8$, potentials $\phi_1$ and $\phi_2$ then being respectively at high level and at low level. During this time, potential $V_4$ applied to grid $G_4$ is at high level, which makes it possible to eliminate all the parasitic charges $Q_p$ present on column connection $c_i$, the charges being transferred over grid $G_2$ to grid $G_4$ and from grid $G_4$ to the parasitic charge elimination diode $D_5$, grid $G_5$ then being raised to a high level potential $V_5$. Throughout this period, charge $Q_{si}$ is transferred beneath the following electrode 31 of output register 3.

This second embodiment described in FIGS. 5 and 7 consequently permits the generation of charge $Q_0$ at the line memory in a completely spatial noise-free manner, because it is determined by the potential applied to grid $G_7$ and then stopped by the same grid during the transfer of the signal charges $Q_{si}$ to output register 3. The residual charges $Q_r$ or parasitic charges $Q_p$ are eliminated before any scan by diode $D_5$ by means of channel $CL_2$ or channel $CL_3$ and in this case via register 3.

FIG. 8 shows a third embodiment of the device according to the invention, which also makes it possible to eliminate the spatial noise in the generation of charge $Q_0$ by means of a two-stage line memory structure. Here the two functions previously fulfilled by storage grid $G_4$ are realised by two separate grids.

FIG. 8 shows a structure identical to that of FIG. 2, one diode $D_2$ per column receiving the column connection $c_{i-1}$, $c_i$ and $c_{i+1}$, followed by grid $G_1$, which is itself followed by grid $G_2$, respectively raised to constant potentials $V_1$ and $V_2$. Grid $G_4$ is now replaced by a first grid $G_{41}$ in the form of a strip and raised to a periodic potential $V_{41}$. Its function is to maintain charge $Q_0$, whose value is determined by a grid $G_3$ which follows $G_{41}$ and raised to a periodic potential $V_3$. Grid $G_3$ is followed by a second grid such as $G_4$, designated in this case $G_{42}$ and having notches 26 identical to the notches 24 of FIG. 2 in which are formed diodes $D_5$. It has the function of branching charges between register 3 and the parasitic charge elimination diodes $D_5$. $G_{42}$ is raised to a periodic potential, $V_{41}$ and the diodes $D_5$ are raised to a constant potential $V_{D5}$.

The columns are separated from one another, as before, by an insulation barrier 42 and diodes $D_5$, surrounded by U-shaped insulation barriers 44 arranged in such a way that one diode $D_5$ is common to two columns and the flow of charges transferred into a column is divided into two channels $CL_1$ and $CL_2$ at grid $G_5$, which is adjacent to diodes $D_5$, as before. The device also has grid $G_7$, raised to potential $V_7$, and output register 3, constructed in the same way as hitherto. Insulation barriers 42 either terminate before diodes $D_5$ or beneath grid $G_7$ by an e.g. square extension 46, in such a way that the charges transferred into channel $CL_1$ can only be transferred towards electrode 32.

FIG. 9a represents a sectional view of the device of FIG. 8 along with a line EE extending from diode $D_2$ to diode $D_5$, then from diode $D_5$ to an electrode 32 of the reading register.

Thus, in FIG. 9a and starting from the left, it is possible to see diode $D_2$ receiving column connection $c_i$, grid $G_1$, grid $G_{41}$, grid $G_2$ between grids $G_1$ and $G_{41}$ and slightly overlapping the latter, grid $G_{42}$, grid $G_3$ placed between grids $G_{41}$ and $G_{42}$ and slightly overlapping them, grid $G_5$ slightly overlapping the latter and diode $D_5$, then grid $G_5$ and grid $G_{42}$, and then grid $G_7$ and grid 32 of the reading register 3.

The various diagrams (a to d) of FIG. 10 represent the control signals which can be used in the device of FIG. 8. These control signals are periodic potentials, whose amplitude varies between a high level and a low level, designated $V_H$ and $V_B$ respectively for all the diagrams. However, these different potentials are not necessarily equal to one another or equal to the potentials of the previous drawings.

Diagram 10a shows potentials $V_{41}$ and $V_{42}$ applied to grids $G_{41}$ and $G_{42}$. It is at low level, except at times $t_1$, $t_2$, $t_3$ and $t_6$, $t_7$, $t_8$, when it is at high level.

Diagram 10b represents potentials $V_3$ and $V_2$ applied to grids $G_3$ and $G_2$; it is at high level during times $t_2$ and $t_7$.

Diagram 10c represents potential $V_5$ applied to grid $G_5$. It is at low level $V_B$, except during times $t_1$, $t_2$, $t_3$ and $t_4$.

Diagram 10d represents potential $V_7$ applied to grid $G_7$. It is at low level except during times $t_6$, $t_7$, $t_8$ and $t_9$, when it is at high level.

Diagrams 9b to 9i represent the potential on the surface of the semiconductor substrate, at different times and increasing in the downward direction.

FIG. 9b represents the surface potential during time $t_1$. Grid $G_2$ is at a low level $V_B$ and isolates the photosensitive zone from the remainder of the device. On the columns, there is the training charge quantity $Q_o$ and a charge quantity $Q_B$ due to a possible overlighting.

FIG. 9c represents the surface potential during time $t_2$. Grids $G_2$ and $G_3$ are at a high level. The charge quantity $Q_o+Q_B$ is transferred in the line memory. Charge quantity $Q_o$ fullfils the potential well beneath grid $G_{41}$ and charge quantity $Q_B$ is transferred under grids $G_{42}$.

FIG. 9d represents the surface potential during time $t_3$. Grid $G_2$ is at a low level. The photosensitive zone is isolated from the remainder of the device. Grid $G_3$ is at a low level separating the grids $G_{41}$ and $G_{42}$.

FIG. 9e represents the surface potential during time $t_4$. Grids $G_{41}$ and $G_{42}$ are at a low level. Charge quantity $Q_o$ is transferred from columns and charge quantity $Q_B$ is evacuated by drain $D_5$.

FIG. 9f represents the surface potential during times $t_5$ and $t_6$.

At time $t_5$, grid $G_5$ is at a low level and isolates the line memory from the drain $D_5$. Moreover a clock signal, not shown on the figure, produces the arrival of the charge quantity $Q_S$ on the column connections. There is then on the columns connections $Q_o+Q_S$.

At time $t_6$, grid $G_7$ and grids $G_{41}$ and $G_{42}$ are at a high level.

FIG. 9g represents the surface potential during time $t_7$. Grid $G_3$ is at a high level and there is communication between grids $G_{41}$ and $G_{42}$. Grid $G_2$ is at a high level and there is transfer from charge quantity $Q_o+Q_S$ from the column connections in the line memory. The charge quantity $Q_o$ is blocked under grid $G_{41}$ and the signal charge quantity $Q_S$ is transferred under grid $G_{42}$.

FIG. 9h represents the surface potential during time $t_8$. Grid $G_2$ is at a low level; so is grid $G_3$.

FIG. 9i represents the surface potential during time $t_9$: Grids $G_{41}$ and $G_{42}$ are at a low level and there is transfer of the signal charge quantity $Q_S$ in the reading register 32 and transfer of the charge quantity $Q_o$ on the columns. The transfer of $Q_o$ on the columns at time $t_9$ explains that at time $t_1$ the charge quantity $Q_o+Q_B$ is on the columns.

In the embodiments of FIGS. 5 and 8, the generation of the charge quantity $Q_o$ in the line memory is quite independent from the spatial noise because this charge is created then stopped by the same grid receiving the same potential. For FIGS. 6d and g, it is the grid $G_7$ at the potential $V_7$. For FIG. 9d and g, it is the grid $G_3$ at potential $V_3$.

In the embodiment of FIG. 8, the transfer from the columns to the line memory of the signal charge quantity $Q_S$ and of the charge quantity $Q_B$ constituted by overlighting charges is made by adding the training charge $Q_o$, independent from the spatial noise, to these charge quantities.

In the embodiments of FIGS. 2 and 5, it would be also possible to add the charge quantity $Q_o$ to the charge quantities $Q_S$ and $Q_B$ when there is transfer of the charges from the columns to the line memory.

In the operating mode of FIG. 8, the grid $G_2$ is no longer at a constant potential as it was in the operating modes of FIGS. 2 and 5.

Where $G_2$ is at a constant potential, after signal charges $Q_S$ have been transferred from $D_2$ to $G_4$, the surface potential at diode $D_2$ is equal to that of grid $G_2$. New signal charges will arrive under $D_2$ only at the time of the next line return. During the time interval between these two arrivals of charges, there is a leakage current which, although the MOS transistor formed by diode $D_2$, grid $G_2$ and the potential well under $G_3$ is blocked, evacuates some charges from $D_2$ to $G_4$. This leakage current is known as subthreshold current. The surface potential at $D_2$ increases slightly from $\Delta V$ compared with that of $G_2$. When the signal charges of the following line are transferred on the column, they must first fill the potential "pocket" $\Delta V$ before charge $Q_{si}$ can be transferred to $G_4$. A quantity of charges $Q_P=C_1 \cdot \Delta V$, where $C_1$ is the column capacity, is blocked on the column and only the difference $Q_{si}-Q_P$ is transferred, so there is a diminution of the useful signal. Sometimes, there is even $Q_P>Q_{si}$. In the operating mode of FIG. 8, the leakage current is delated by applying to grid $G_2$ not a continuous voltage $V_2$, but a periodic signal $V_2$ having periodically a high and a low level.

So, during the line time, the signal $V_2$ is at a low level. There is a large potential barrier between the potential at $D_2$ and the potential under grid $G_2$. The leakage current is then negligible.

During the line return time when charges have to be transferred from the columns to $G_4$, the signal $V_2$ is at a high level. The potential barrier becomes zero, so the potential at $D_2$ equals that of grid $G_2$.

This pulse on $G_2$ occurs each time there is transfer from the columns to the line memory, of reading signal charges or of overlighting charges $Q_B$ at the end of the line time, for example.

The amplitude of the pulse on $G_2$ is approximately 1V to efficaciously reduce the leakage current, and it is approximately 10 to 15 Volts for the different control signals referred to hereinbefore.

Grid $G_1$ is quite important in this mode of operating. It deletes the parasitic coupling between $G_2$ and $D_2$ which would have maintained the potential barrier when there is a pulse on $G_2$. The diode $D_2$, whithout the grid $G_1$, whould follow the potential of $G_2$ because of its coupling capacity with $G_2$.

In the embodiments of FIGS. 2 and 5, it is also possible to maintain the grid $G_1$ at a constant potential and to apply to grid $G_2$ a periodic signal so as to maintain it at a low level, except when there is transfer of charges to the line memory.

The above description has been given relative to a non-limitative embodiment. Thus, the relative positioning of grids $G_1$, $G_5$ and $G_7$ of diodes $D_2$ and $D_5$, as well as their dimensions, have no particular function and instead only devolve from the technological construction procedure. In the same way, the shape of the insulation barriers 43 and 46 are of a random nature, which also applies with respect to the shape of notches 24 and 26.

What is claimed is:

1. An area image sensory device comprising:
   (a) a semiconductor substrate,
   (b) a plurality of elementary photosensitive areas formed on said substrate and separated from one another and formed in a matrix of N lines and M columns, and in said areas electrical charge signals are produced proportional to received illumination of an image;
   (c) a charge transfer device formed on said substrate having line memory means with M areas for receiving in parallel the electrical charge signals from M photosensitive areas which are all in a same line and periodically supplying said charge signals to an output; said line memory means having
      (i) first grid means ($G_1$) adapted to be connected to a constant potential ($V_1$) and located between the matrix and said areas of the memory for insuring decoupling between said areas of the matrix and the charge transfer device,
      (ii) at least one charge storage grid adapted to be connected to a periodic amplitude alternating potential for maintaining the electrical charge signals,
      (iii) supplementary grid means adjacent to said storage grid for receiving a periodic amplitude alternating potential,
      (iv) parasitic charge removal means having a plurality of removal diodes for draining parasitic charges from each of said columns, and
      (v) control grid means for receiving a periodic amplitude alternating potential and for controlling access to said removal diodes, a training charge (Qo) being maintained beneath said storage grid during said parasitic charge drawing and during receiving said electrical charge signals only by a potential barrier beneath said supplementary grid means being caused by said periodic potential received by said grid means reaching a predetermined amplitude; and
   (d) analog shift register means for receiving in parallel said charge signals supplied by said line memory and for supplying in series an output picture scanning signal.

2. A device according to claim 1 wherein the line memory means further comprises a further storage grid located between said first grid means and said one charge storage grid and separated from said one charge storage grid by a supplementary grid, said two storage grids means storing the electrical charge signal.

3. A device according to claim 1 wherein the line memory means further comprises second grid means located between the storage grid and said first grid means for fixing a potential at column connections between said row memory and said matrix and insuring charge transfer from the matrix to the line memory means.

4. A device according to claim 3 wherein said second grid means is adapted to be connected to a periodic amplitude alternating potential for authorizing a charge transfer of electrical charge signals from said M photosensitive areas to said line memory.

5. A device according to claim 3 wherein said second grid means ($G_2$) is adapted to be raised to a rising potential for transferring electrical charge signals (QS) coming from an overlighting (QB) from said M photosensitive areas and the column connections to the line memory means, a charge quantity (QO) being added to the electrical charge signals when there is a transfer from the column connections to the line memory means.

6. A device according to claim 2 wherein the line memory also comprises second grid means located between the storage grid and said first grid means for fixing a potential at column connections between said matrix and said line memory and insuring charge transfer from the matrix to the line memory means.

7. A device according to claim 6 wherein the second grid means is adapted to be raised to a periodic amplitude alternating potential for authorizing a charge transfer from said column connection to said line memory means.

8. A device according to claim 6 wherein said second grid means is adapted to be raised to a rising potential for transferring signal charges (QS) coming from an overlighting (QB) from said column connections to said line memory; a charge quantity (QO) being added to the signal charges and to the overlighting charges during transfer from said column connections to said line memory means.

9. A device according to claim 1 wherein said storage grid has notches in which are placed said charge removal diodes.

10. A device according to claim 9 wherein said notches are positioned with each charge removal diode being common to two channels.

11. A device according to claim 9 wherein said storage grid has one notch per channel.

12. A device according to claim 1 further comprising connecting means for supplying in parallel said electrical charge signals produced in M elementary photosensitive areas of the same line of the matrix, successively for N lines; said connecting means having a plurality of reading diodes and reception diodes, said reading diodes being arranged in columns between said elementary selective areas and M reception diodes located at an input to said charge transfer device from said matrix; each of said reading diodes being electrically coupled to a corresponding reception diode.

13. A device according to claim 12 wherein each of said elementary sensitive areas of said matrix comprises a MOS capacitance having a first charge election zone including a grid, common to capacitances of a same line, and a second charge election zone electrically coupled to said capacitances, and means for forming a screen for the electrical charge signals positioned between each of said elementary sensitive areas and said connecting means, said screen means having a plurality of grids adapted to be raised to a constant potential and arranged in columns between said reading diode and said photosensitive points.

14. A device according to claim 1 wherein said periodic amplitude alternating potentials are such that the injection of the previously defined charge quantity is brought about beneath the storage grid by the charge transfer removal diode.

15. A device according to claim 14 wherein the periodic potentials are such that charges are injected beneath the storage grid by the charge removal diode, the quantity of charges beneath the storage grid being brought to a previously defined charge quantity by means of a supplementary grid controlling the access to the shift register, the residual charge quantity being eliminated on the charge removal diode after transit in the shift register.

16. A device according to claim 2 wherein the electrical charge signal is maintained beneath the storage grid at all times except during a transfer of the electrical charge signal to the line memory.

17. A device according to claim 12 further comprising a screen which is opaque to received illumination and which screen covers those portions of the device having the diodes.

18. A device according to claim 1 wherein an insulating layer covers semiconductor substrate.

19. A device according to claim 18 wherein said insulating layer comprises an overdoping from the semiconductor substrate.

* * * * *